United States Patent [19]

Pierce

[11] 4,354,160

[45] Oct. 12, 1982

[54] AMPLITUDE EQUALIZER

[75] Inventor: Lyle R. Pierce, Portland, Oreg.

[73] Assignee: Kentrox Industries, Inc., Portland, Oreg.

[21] Appl. No.: 165,072

[22] Filed: Jul. 1, 1980

[51] Int. Cl.³ ............................................. H03F 3/68
[52] U.S. Cl. .................................... 330/107; 330/151; 330/304; 333/28 R
[58] Field of Search ............... 330/107, 109, 126, 304, 330/151; 333/28 R, 28 T; 179/1 D

[56] References Cited

U.S. PATENT DOCUMENTS 3,940,709 2/1976 Heaslett .............................. 330/107

OTHER PUBLICATIONS

Kalb, "A Novel Active Filter", *EEE*, Feb. 1971, p. 61.
Tellabs Model 4001, 4002, and 4003 Line Amplifiers, Copyright Jun. 2, 1977, and Jan. 2, 1978.
Wescom Model 401 and 4011 Line Amplifiers, Dated Apr. 1977 and Aug. 1972, respectively.
Wescom Model 7406, 7407, 7408, and 7811 Amplitude Equalizers, Jul. 1974 and Nov. 1977, respectively.
*Bell System Practices,* "950A-Type Equalizer", Oct. 1974.
Western Electric Metallic Facility Terminal, 4-4 Wire Repeaters, 2-4 Wire Repeater, Aug. 1975.
Western Electric Metallic Facility Terminal, 4-Wire Transmission Units (J99343RA, SA, SB), SD-1C3-59-01, Aug. 1975.

*Primary Examiner*—James B. Mullins
*Attorney, Agent, or Firm*—Arnold, White & Durkee

[57] ABSTRACT

An amplitude equalizer, suitable for use on telephone lines, is disclosed. The circuit includes an adjustable-gain amplifier, and an adjustable-slope equalizer section. A mixer section serves to combine the input signal with a filtered version thereof, in a manner which enables the installer to bring the line of response to specification level at a first predetermined frequency, and then to bring the line to specification level at a second frequency, without disturbing the previously achieved gain at the first frequency.

1 Claim, 7 Drawing Figures

AMPLITUDE EQUALIZER

This invention relates to amplitude equalizers, which may be used in connection with unloaded telephone cables.

BRIEF DESCRIPTION OF THE DRAWINGS

In the following description of the preferred embodiment of the invention, reference may be had to the drawings, in which.

BACKGROUND OF THE INVENTION

Figure 1:
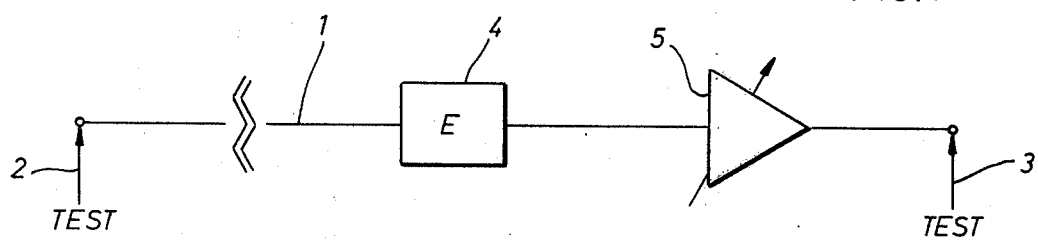
FIG. 1 is a schematic illustration of an unloaded cable under test, with amplification and equalization apparatus.
Figure 2:
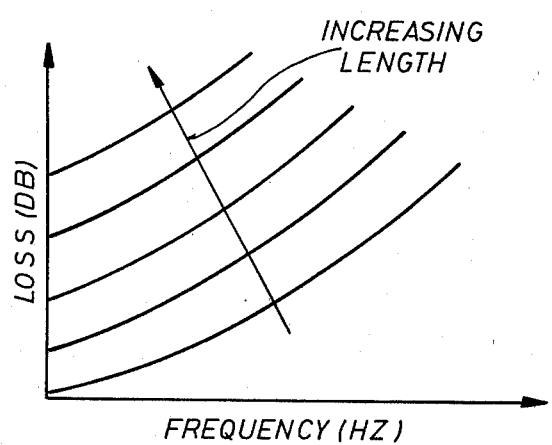
FIG. 2 is a set of typical curves showing loss of a cable as a function of frequency and as a function of cable length.

Band-limited cables for transmitting electrical signals, for example, telephone cables, are of various gauges. The distance between a telephone operating company's central office and the locations of the subscribers served by that office is variable; hence, telephone cables of varying lengths are required. Nevertheless, it is desirable that the loss characteristics of such cables be maintained the same as nearly as possible, so that a subscriber's distance from the central office will not affect the quality of voice signals communicated in either direction between the central office and the subscriber. To meet this requirement, it has been common for telephone line installers to test the line, using an arrangement similar to that shown in FIG. 1 of the drawings. An unloaded cable 1 has test points 2 and 3 at its ends. Such cables typically have a loss characteristic illustrated in FIG. 2 of the drawings. In FIG. 2 it is seen that loss in a given cable generally increases as a function of frequency; the loss is greater as the length of the cable increases. To alleviate these two problems, it has been common to employ some sort of equalization apparatus and amplification apparatus, shown diagrammatically at 4 and 5, respectively, in FIG. 1.

The installer will initially test the line at a particular frequency, for example, one kilohertz. He will then adjust amplification apparatus 5 in order to obtain a test output in accordance with telephone company specifications. He then tests at a second frequency, for example, three kilohertz, and will find that the line response is a number of db down from specification. The installer then adjusts equalization apparatus 4 to bring the three kilohertz response up to the level where the one kilohertz was in the preceding measurement. However, in introducing this equalization, the line response at one kilohertz will now have changed. The installer therefore has to test the line again at one kilohertz, adjust the amplification apparatus 5 to obtain a response according to specification, readjust the equalization at three kilohertz, and so forth. In this manner, a combination of equalization and amplification settings is obtained which will produce a relatively flat line response over the entire frequency band of the line (typically 300 hertz to 3000 hertz in the case of an ordinary telephone line).

Figure 3:
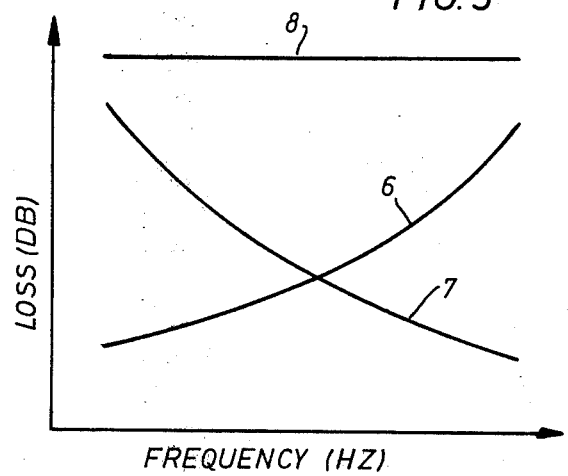
FIG. 3 is a set of typical curves showing cable loss, with amplification and equalization added.

The response of the line, with the above amplification and equalization, is illustrated in FIG. 3 of the drawings. The loss of the line, with amplification, is shown by curve 6. The loss introduced by the equalization apparatus is shown by curve 7. The net loss is shown by curve 8, which is desirably flat throughout the frequency band.

SUMMARY OF THE INVENTION

It would be desirable to eliminate the need for the above-described back-and-forth adjustments of equalization and amplification, and this is what the present invention is designed to do.

Figure 4:
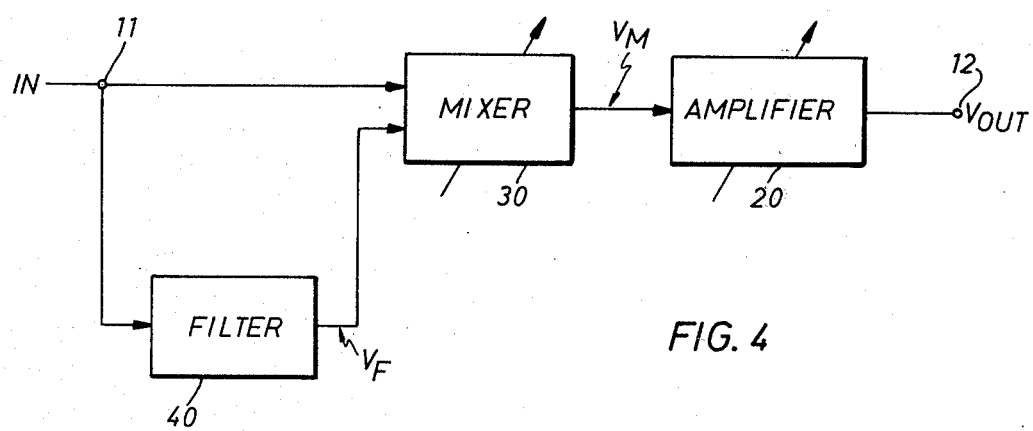
FIG. 4 is a diagrammatic representation of the circuitry of the present invention.

Circuitry for accomplishing this result is shown diagrammatically in FIG. 4 of the drawings. The voltage coming in from the cable is designated $V_{in}$, and is applied at input terminal 11. The output voltage, $V_{out}$, appears at terminal 12. The circuitry for accomplishing the aboverecited functions may generally be thought of as being composed of three principal sections: An adjustable amplifier section 20; an adjustable mixer section 30 before the amplifier input; and a filter section 40, which filters the input voltage $V_{in}$, and supplies it to the mixer section 30. $V_{in}$, in its unfiltered form, is also applied to mixer section 30. The output of mixer section 30 is designated $V_m$.

The filter section 40 and the mixer section 30 cooperate to supply the degree of equalization necessary to bring the frequency response of the telephone cable within specified limits at upper and lower points within the telephone band, i.e., between 300 hz and 2600 hz.

According to the present invention, mixer section 30 mixes the input voltage $V_{in}$ with the filter output $V_f$, such that:

(1) For a unique voltage ratio ($V_{in}/V_f$), the mixer output voltage $V_m$ should be constant over the full mixer range, i.e., over the full range of equalization settings.

(2) At one adjustment extreme of the mixer, the mixer output $V_m$ should be independent of the filter output $V_f$.

(3) At the opposite adjustment extreme, the mixer output $V_m$ should vary in direct proportion with the filter output $V_f$.

The above-specified circuit functions may, for ease of description, be set forth mathematically as follows:

$$V_{in}(A) + V_f(B) = V_m \qquad \text{(EQ. 1)}$$

Combine this expression with the filter transfer function:

$$\text{Let } X = (V_f/V_{in}) \qquad \text{(EQ. 2)}$$

Therefore, $$V_f = V_{in}(X) \qquad \text{(EQ. 3)}$$

Now, substitute EQ. 3 in to EQ. 1:

$$V_{in}(A) + V_{in}(X)(B) = V_m \qquad \text{(EQ. 4)}$$

and simplify to $V_{in}(A + BX) = V_m$.

$$(V_m/V_{in}) = A + BX \qquad \text{(EQ. 5)}$$

Figure 6:
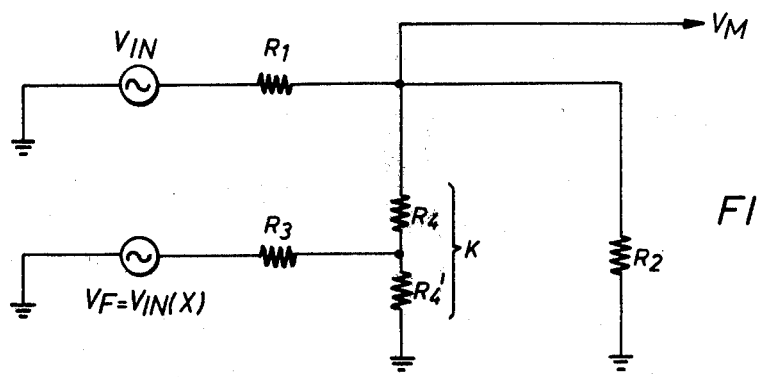
FIG. 6 is an equivalent circuit schematic for the mixer section of the present invention.

We can now determine the coefficients A&B by considering the equivalent mixer circuit shown in FIG. 6 of the drawings. Assume $V_{in}$ and $V_f$ are no-impedance voltage sources. A is derived by shorting $V_f$ $$\frac{R_2R_3K + R_2R_4(K - R_4)}{R_1R_3K + R_1R_4(K - R_4) + R_1R_2R_3 + R_1R_2(K - R_4) + R_2R_3K + R_2R_4(K - R_4)} \qquad \text{(EQ. 6)}$$

B is derived in a similar manner, by shorting $V_{in}$.

$$\frac{R_1R_2[R_1R_2(K - R_4) + R_4(K - R_4)(R_1 + R_2)]}{[R_1R_2 + (R_1 + R_2)R_4][R_1R_3K + R_1R_4(K - R_4) + R_1R_2R_3 + R_1R_2(K - R_4) + R_2R_3K + R_2R_4(K - R_4)]} \qquad \text{(EQ. 7)}$$

Using EQ. 5, and the coefficients A and B from EQ. 6 and EQ. 7, we now wish to find a unique $X_1$, which gives a constant $(V_m/V_{in})$ as $R_4$ varies.

We now wish to equate the transfer functions at the $R_4$ extremes:

$$A_{R_4=0} + (B_{R_4=0})X_1 = A_{R_4=K} + (B_{0R_4=K})X_1 \qquad \text{(EQ. 8)}$$

$$X_1 = \frac{A_{R_4=K} - A_{R_4=0}}{B_{R_4=0}} \qquad \text{(EQ. 9)}$$

Using $X_1$ with coefficients A and B when $R_4 = (K/2)$, choose $R_1$, $R_2$, $R_3$, and K which will closely approximate the equality:

$$A_{R_4=K/2} + (B_{R_4=K/2})X_1 = A_{R_4=K} \qquad \text{(EQ. 10)}$$

When $R_4 = K$, the B term of EQ. 5 equals zero; therefore, $V_f$ has no effect on $V_m$.

$(V_f/V_{in})$ is chosen to yield a function $X(f)$ which gives the desired $V_m(f)$ in the equation $V_m = V_{in} \cdot (A + BX)$.

Figure 5:
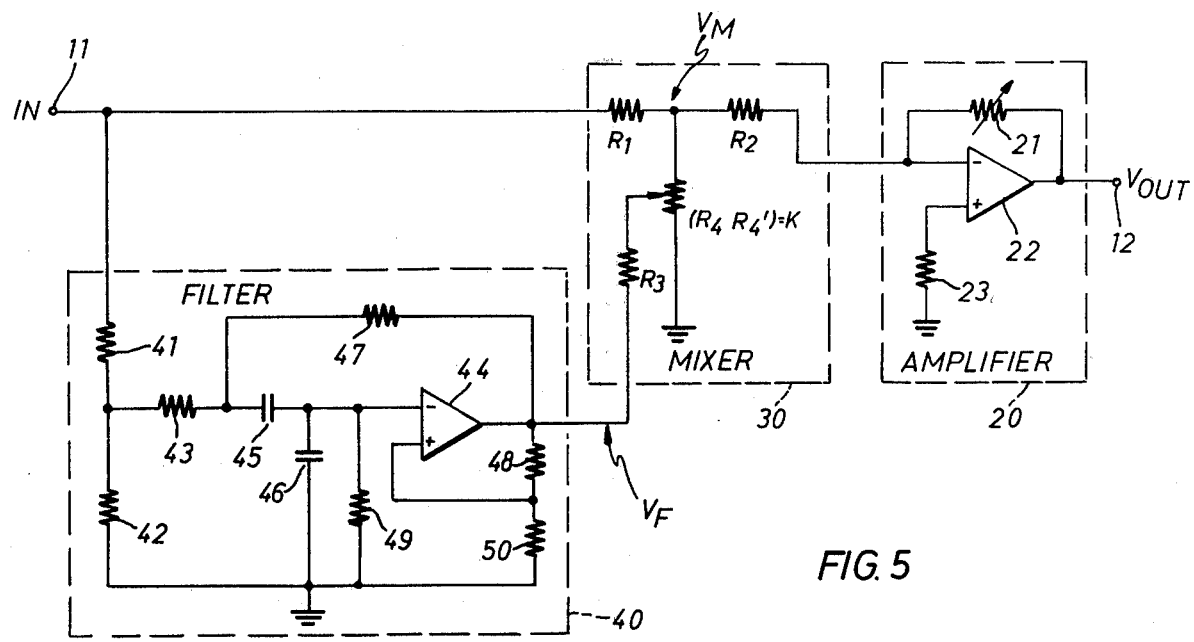
FIG. 5 is a schematic drawing of one embodiment of the present invention.

A preferred way to implement the foregoing mathematical requirements is shown in, and will be described with respect to, FIG. 5 of the drawings. In this particular embodiment of the invention, a potentiometer forms the $R_4$ and $R_4'$ combination. The node where $R_3$, $R_4$ and $R_4'$ meet represents the potentiometer wiper.

Values for $R_1$, $R_2$, $R_3$ and K are chosen to give A and B coefficients described above, which meet the following specific requirements in this embodiment:

(1) For a discrete value of $X_1$ at 1 khz, A, B and $X_1$ should give a constant $(V_m/V_{in})$ (see EQ. 5) over the full adjustment range of $(R_4 + R_4')$.

(2) When $R_4 = K$ ohms and for any value of X: A, B and X shall give a constant $(V_m/V_{in})$ (see EQ. 5) which is equal to $(V_m/V_{in})$ at 1 khz.

(3) When $R_4 = $ zero ohms, and for a discrete value $X_2$ at 3 khz: A, B, and $X_2$ shall give a $V_m$ (EQ. 5) which is 12 db greater than $(V_m/V_{in})$ at 1 khz.

Using the methods described above, resistor values may be assigned as follows:

$R_1 = 14.7$ kilohms $R_2 = 1.58$ kilohms $R_3 = 2.43$ kilohms $K = 20$ kilohms

A bandpass filter may be chosen in this embodiment to give a transfer function which satisfies $X_1$ and $X_2$ requirements, and is continuous between $X_1$ and $X_2$. Filter selection to meet these requirements will be known to those skilled in the art. The circuit arrangement may be as shown in FIG. 5, where filter 40 comprises resistors 41, 42 and 43; operational amplifier 44; capacitors 45 and 46; and resistors 47, 48, 49 and 50; all connected as shown in FIG. 5.

The values for these components may be:

41 = 536 ohms
42 = 133 ohms
43 = 16.5 kilohms
45 = 0.0039 microfarads
46 = 0.0039 microfarads
47 = 16.5 kilohms
48 = 28.7 kilohms
49 = 16.5 kilohms
50 = 8.87 kilohms With the resistor values for the mixer section selected as specified above, the value of the filter transfer function $X_1$ at 1 khz is 0.0906. For this value of the filter transfer function, the transfer function of the filter-and-mixer combination, $A + BX_1$ will be approximately constant throughout the entire range of adjustment of the potentiometer K in FIG. 5. The implication of this is most important: The overall gain of the filter-and-mixer combination will be constant at 1 khz, regardless of the amount of equalization introduced by the setting of potentiometer K.

This permits the selection of an amount of equalization which will approximately offset the increasing loss of the cable 1 as frequency increases from 1 khz to some higher frequency, e.g., 3 khz. The setting of potentiometer K will be chosen to provide a slope for the filter-mixer gain characteristic between 1 khz and 3 khz, which is "complementary" to the loss characteristic of the cable 1 in that range.

With the present invention, this complementary matching technique is very easily accomplished by the installer: A test signal at 1 khz is sent through the line, and appears at input terminal 11. Feedback resistor 21 in the amplifier section 20 is adjusted so that the voltage $V_{out}$ appearing at output terminal 12 is brought to specification level. (The arrangement of amplifier section 20, comprising operational amplifier 22, bias resistor 23, and adjustable feedback resistor 21, are standard in the art.) While this adjustment is being made, it does not matter what the setting of potentiometer K in the mixer section is, because the filter-mixer design has been chosen such that the gain effected by the filter-mixer combination at 1 khz is independent of the potentiometer setting.

A second test signal, at 3 khz, is then sent through the line and introduced to input terminal 11. Now an equalization adjustment is made by varying the setting of potentiometer K in mixer section 30, so that the amplitude of the voltage $V_{out}$ is brought to the value specified for $V_{out}$ at 1 khz.

By the foregoing procedure, an equalization gain having a slope "complementary" to the slope of the line-plus-amplifier characteristic is achieved. In this manner, the overall gain characteristic of the circuit, including the line, the filter, the mixer, and the amplifier, is maintained approximately constant throughout the bandwidth of interest.

Figure 7:
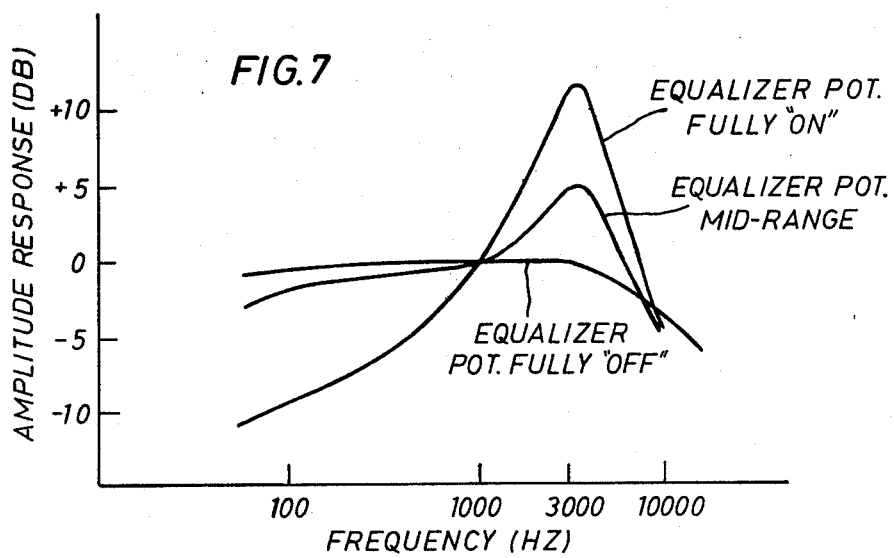
FIG. 7 is a plot of equalizer response (db) as a function of frequency (logarithmic scale) for one embodiment of the present invention.

FIG. 7 of the drawings shows the equalization characteristics obtained for the preferred embodiment of the present invention, with the component values described above. It will be seen that with the potentiometer K fully off, i.e., the filter output $V_f$ is grounded, there is no equalizer gain in the band of interest. For the opposite setting of the potentiometer K, $R_4=0$ and the equalizer gain in the band of interest (1 khz to 3 khz) is steeply upward. For all settings of the potentiometer K, the gain a 1 khz is the same. The gain at this frequency is thus independent of the potentiometer setting. Hence the circuit gain, once properly set at 1 khz, will remain properly set, despite the addition of equalization needed to achieve proper circuit gain at 3 khz.

It will be apparent to persons skilled in the art that numerous modifications of the preceding description of the preferred embodiment may be devised, taking advantage of the principles and functions of the invention. Component values may be chosen differently; the test-signal frequencies may be different from the one khz and three khz frequencies chosen for the foregoing embodiment; and the filter, mixer, and amplifier sections may be implemented by circuits different from those shown in the foregoing embodiment. It is the intent of the claims following herein to embrace such equivalent modifications.

As used herein, the term "connected" is not limited to direct electrical connection, but rather in the sense of operatively connected; that is, the connection may be through intervening electrical elements.

What is claimed is:

1. An amplitude equalizer circuit, comprising:
   (a) circuit input and circuit output terminals;
   (b) a filter section connected to the circuit input terminal;
   (c) an adjustable-gain amplifier section connected to the circuit output terminal;
   (d) an adjustable-ratio mixer section connected between said filter section and said amplifier section, said mixer section also being connected to the circuit input terminal, said mixer section including adjustable resistor-divider means having a range of settings, the output of said mixer section at one extreme of said setting range being independent of the output of said filter section, said resistor-divider means including:
      (i) first and second resistors with a node between them, the other side of said first resistor being connected to said circuit input terminal, and the other side of said second resistor being connected to the input of said amplifier section;
      (ii) a potentiometer connected to said node between the first and second resistors and having an adjustable wiper contact;
      (iii) a third resistor connected between said wiper contact and the output of said filter section,
   the output voltage of said mixer section being constant and independent of the potentiometer setting, for a given constant input voltage at a single predetermined frequency.

* * * * *